United States Patent
Barnes et al.

(10) Patent No.: US 9,340,760 B2
(45) Date of Patent: May 17, 2016

(54) NON-AMINE POST-CMP COMPOSITION AND METHOD OF USE

(71) Applicant: ADVANCED TECHNOLOGY MATERIALS, INC., Danbury, CT (US)

(72) Inventors: Jeffrey A. Barnes, Bethlehem, CT (US); Jun Liu, Brookfield, CT (US); Peng Zhang, Montvale, NJ (US)

(73) Assignee: ADVANCED TECHNOLOGY MATERIALS, INC., Danbury, CT (US)

( * ) Notice: Subject to any disclaimer, the term of this patent is extended or adjusted under 35 U.S.C. 154(b) by 162 days.

(21) Appl. No.: 14/305,786

(22) Filed: Jun. 16, 2014

(65) Prior Publication Data

US 2014/0352739 A1 Dec. 4, 2014

Related U.S. Application Data

(63) Continuation of application No. 12/709,054, filed on Feb. 19, 2010, now Pat. No. 8,754,021.

(60) Provisional application No. 61/156,459, filed on Feb. 27, 2009.

(51) Int. Cl.
| | | |
|---|---|---|
| *C11D 11/00* | (2006.01) | |
| *C11D 3/04* | (2006.01) | |
| *C11D 3/33* | (2006.01) | |
| *C11D 3/43* | (2006.01) | |
| *C11D 7/06* | (2006.01) | |
| *C11D 7/26* | (2006.01) | |
| *C11D 7/32* | (2006.01) | |
| *C11D 7/50* | (2006.01) | |
| *C11D 7/08* | (2006.01) | |
| *C11D 3/20* | (2006.01) | |

(52) U.S. Cl.
CPC ............ *C11D 11/0047* (2013.01); *C11D 3/044* (2013.01); *C11D 3/2075* (2013.01); *C11D 3/33* (2013.01); *C11D 3/43* (2013.01); *C11D 7/06* (2013.01); *C11D 7/08* (2013.01); *C11D 7/265* (2013.01); *C11D 7/267* (2013.01); *C11D 7/3245* (2013.01); *C11D 7/5004* (2013.01); *C11D 7/5022* (2013.01); *C11D 3/2041* (2013.01); *C11D 3/2065* (2013.01); *C11D 7/50* (2013.01)

(58) Field of Classification Search
CPC ....... C11D 11/0047; C11D 7/265; C11D 7/06
USPC ........................................................ 510/175
See application file for complete search history.

(56) References Cited

U.S. PATENT DOCUMENTS

| | | | | |
|---|---|---|---|---|
| 5,334,332 A * | 8/1994 | Lee | ........................ | B24B 37/042 134/2 |
| 5,958,794 A * | 9/1999 | Bruxvoort | ............... | B24B 7/228 216/88 |
| 6,156,661 A * | 12/2000 | Small | ........................ | B08B 3/08 134/40 |
| 6,194,317 B1 * | 2/2001 | Kaisaki | .................... | B24B 7/228 257/E21.304 |
| 6,350,393 B2 | 2/2002 | Francis et al. | | |
| 6,498,132 B2 | 12/2002 | Morinaga et al. | | |
| 7,704,939 B2 * | 4/2010 | Suzuki | ..................... | C11D 1/04 134/1.2 |
| 7,846,265 B1 | 12/2010 | Badesha et al. | | |
| 7,922,823 B2 | 4/2011 | Walker et al. | | |
| 8,906,838 B2 | 12/2014 | Hsu | | |
| 2005/0245411 A1 | 11/2005 | Yang et al. | | |
| 2007/0225186 A1 * | 9/2007 | Fisher | ...................... | C11D 7/06 510/175 |
| 2008/0026583 A1 * | 1/2008 | Hardy | ................... | B24B 37/044 438/693 |
| 2008/0045016 A1 * | 2/2008 | Andou | ...................... | C11D 3/37 438/692 |
| 2008/0076688 A1 | 3/2008 | Barnes et al. | | |
| 2008/0210900 A1 * | 9/2008 | Wojtczak | .......... | H01L 21/31111 252/79.3 |
| 2008/0220441 A1 | 9/2008 | Birnbaum et al. | | |
| 2008/0261847 A1 | 10/2008 | Visintin et al. | | |
| 2009/0107520 A1 | 4/2009 | Lee et al. | | |
| 2009/0130849 A1 | 5/2009 | Lee | | |
| 2009/0133716 A1 | 5/2009 | Lee | | |
| 2009/0137191 A1 | 5/2009 | Lee | | |
| 2009/0239777 A1 | 9/2009 | Angst et al. | | |
| 2010/0043823 A1 | 2/2010 | Lee | | |
| 2010/0056409 A1 * | 3/2010 | Walker | ..................... | C11D 7/06 510/175 |
| 2010/0056410 A1 * | 3/2010 | Visintin | ................. | C11D 1/008 510/176 |
| 2010/0105595 A1 | 4/2010 | Lee | | |

(Continued)

FOREIGN PATENT DOCUMENTS

| | | |
|---|---|---|
| CN | 1387556 A | 12/2002 |
| CN | 102135735 A | 7/2011 |
| EP | 2034365 A2 | 3/2009 |

(Continued)

OTHER PUBLICATIONS

Chinese Office Action, Apr. 9, 2015.

(Continued)

*Primary Examiner* — Gregory Webb
(74) *Attorney, Agent, or Firm* — Tristan A. Fuierer; Moore & Van Allen, PLLC; Rosa Yaghmour

(57) ABSTRACT

A cleaning composition and process for cleaning post-chemical mechanical polishing (CMP) residue and contaminants from a microelectronic device having said residue and contaminants thereon. The cleaning compositions are substantially devoid of amine and ammonium-containing compounds, e.g., quaternary ammonium bases. The composition achieves highly efficacious cleaning of the post-CMP residue and contaminant material from the surface of the microelectronic device without compromising the low-k dielectric material or the copper interconnect material.

17 Claims, No Drawings

(56) References Cited

U.S. PATENT DOCUMENTS

2010/0112728 A1    5/2010   Korzenski et al.
2010/0261632 A1*  10/2010   Korzenski .............. C11D 7/265
                                                        510/175

FOREIGN PATENT DOCUMENTS

| JP | 2009069505 A | 4/2009 |
| JP | 2009275077 A | 11/2009 |
| WO | 0044034 A1 | 7/2000 |
| WO | 2007044446 A1 | 4/2007 |
| WO | 2007047365 A2 | 4/2007 |
| WO | 2010098899 A1 | 9/2010 |

OTHER PUBLICATIONS

Supplementary European Search Report, Apr. 30, 2015.
Taiwanese Office Action, Jun. 17, 2015.
International Search Report for PCT/US2011/057287 dated May 18, 2012.

* cited by examiner

US 9,340,760 B2

NON-AMINE POST-CMP COMPOSITION AND METHOD OF USE

CROSS REFERENCE TO RELATED APPLICATIONS

This application is a continuation of U.S. patent application Ser. No. 12/709,054, filed on Feb. 19, 2010, now U.S. Pat. No. 8,754,021 issued on Jun. 17, 2014, which claims the priority of U.S. Provisional Patent Application No. 61/156,459 for "Non-Amine Post-CMP Composition and Method of Use," filed on Feb. 27, 2009, in the name of Jeffrey A. Barnes et al., all of which are hereby incorporated by reference in their entirety.

FIELD

The present invention relates generally to compositions for cleaning residue and/or contaminants from microelectronic devices having same thereon.

DESCRIPTION OF THE RELATED ART

Microelectronic device wafers are used to form integrated circuits. The microelectronic device wafer includes a substrate, such as silicon, into which regions are patterned for deposition of different materials having insulative, conductive or semi-conductive properties.

In order to obtain the correct patterning, excess material used in forming the layers on the substrate must be removed. Further, to fabricate functional and reliable circuitry, it is important to prepare a flat or planar microelectronic wafer surface prior to subsequent processing. Thus, it is necessary to remove and/or polish certain surfaces of a microelectronic device wafer.

Chemical Mechanical Polishing or Planarization ("CMP") is a process in which material is removed from a surface of a microelectronic device wafer, and the surface is polished (more specifically, planarized) by coupling a physical process such as abrasion with a chemical process such as oxidation or chelation. In its most rudimentary form, CMP involves applying slurry, e.g., a solution of an abrasive and an active chemistry, to a polishing pad that buffs the surface of a microelectronic device wafer to achieve the removal, planarization, and polishing processes. It is not desirable for the removal or polishing process to be comprised of purely physical or purely chemical action, but rather the synergistic combination of both in order to achieve fast, uniform removal. In the fabrication of integrated circuits, the CMP slurry should also be able to preferentially remove films that comprise complex layers of metals and other materials so that highly planar surfaces can be produced for subsequent photolithography, or patterning, etching and thin-film processing.

Recently, copper has been increasingly used for metal interconnects in integrated circuits. In copper damascene processes commonly used for metallization of circuitry in microelectronic device fabrication, the layers that must be removed and planarized include copper layers having a thickness of about 1-1.5 µm and copper seed layers having a thickness of about 0.05-0.15 µm. These copper layers are separated from the dielectric material surface by a layer of barrier material, typically about 50-300 Å thick, which prevents diffusion of copper into the oxide dielectric material. One key to obtaining good uniformity across the wafer surface after polishing is to use a CMP slurry that has the correct removal selectivities for each material.

The foregoing processing operations, involving wafer substrate surface preparation, deposition, plating, etching and chemical mechanical polishing, variously require cleaning operations to ensure that the microelectronic device product is free of contaminants that would otherwise deleteriously affect the function of the product, or even render it useless for its intended function. Often, particles of these contaminants are smaller than 0.3 µm.

One particular issue in this respect is the residues that are left on the microelectronic device substrate following CMP processing. Such residues include CMP material and corrosion inhibitor compounds such as benzotriazole (BTA). If not removed, these residues can cause damage to copper lines or severely roughen the copper metallization, as well as cause poor adhesion of post-CMP applied layers on the device substrate. Severe roughening of copper metallization is particularly problematic, since overly rough copper can cause poor electrical performance of the product microelectronic device.

Another residue-producing process common to microelectronic device manufacturing involves gas-phase plasma etching to transfer the patterns of developed photoresist coatings to the underlying layers, which may consist of hardmask, interlevel dielectric (ILD), and etch stop layers. Post-gas phase plasma etch residues, which may include chemical elements present on the substrate and in the plasma gases, are typically deposited on the back end of the line (BEOL) structures and if not removed, may interfere with subsequent silicidation or contact formation. Conventional cleaning chemistries often damage the ILD, absorb into the pores of the ILD thereby increasing the dielectric constant, and/or corrode the metal structures.

SUMMARY

The present invention generally relates to a composition and process for cleaning residue and/or contaminants from microelectronic devices having said residue and contaminants thereon. The cleaning compositions of the invention are substantially devoid of amine and ammonium species. The residue may include post-CMP, post-etch, and/or post-ash residue.

In one aspect, a cleaning composition comprising at least one basic salt, at least one organic solvent, at least one complexing agent, and water, wherein the composition is substantially devoid of amine and ammonium-containing salts is described.

In another aspect, a cleaning composition consisting essentially of at least one basic salt, at least one organic solvent, at least one complexing agent, and water, wherein the composition is substantially devoid of amine and ammonium-containing salts is described.

In still another aspect, a cleaning composition consisting of at least one basic salt, at least one organic solvent, at least one complexing agent, and water, wherein the composition is substantially devoid of amine and ammonium-containing salts is described.

Another aspect relates to a kit comprising, in one or more containers, one or more of the following reagents for forming a cleaning composition, said one or more reagents selected from the group consisting of: at least one basic salt; at least one organic solvent; at least one chelating agent; and optionally at least one surfactant; wherein the kit is adapted to form the composition.

Still another aspect relates to a method of removing residue and contaminants from a microelectronic device having said residue and contaminants thereon, said method comprising contacting the microelectronic device with a cleaning composition for sufficient time to at least partially clean said residue and contaminants from the microelectronic device, wherein the cleaning composition includes at least one basic salt; at least one organic solvent; at least one chelating agent; optionally at least one surfactant; and water.

Other aspects, features and advantages will be more fully apparent from the ensuing disclosure and appended claims.

DETAILED DESCRIPTION, AND PREFERRED EMBODIMENTS THEREOF

The present invention relates generally to compositions useful for the removal of residue and contaminants from a microelectronic device having such material(s) thereon. The compositions are particularly useful for the removal of post-CMP, post-etch or post-ash residue.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As used herein, "residue" corresponds to particles generated during the manufacture of a microelectronic device including, but not limited to, plasma etching, ashing, chemical mechanical polishing, wet etching, and combinations thereof.

As used herein, "contaminants" correspond to chemicals present in the CMP slurry, reaction by-products of the polishing slurry, chemicals present in the wet etching composition, reaction by products of the wet etching composition, and any other materials that are the by-products of the CMP process, the wet etching, the plasma etching or the plasma ashing process.

As used herein, "post-CMP residue" corresponds to particles from the polishing slurry, e.g., silica-containing particles, chemicals present in the slurry, reaction by-products of the polishing slurry, carbon-rich particles, polishing pad particles, brush deloading particles, equipment materials of construction particles, copper, copper oxides, organic residues, and any other materials that are the by-products of the CMP process.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "complexing agent" includes those compounds that are understood by one skilled in the art to be complexing agents, chelating agents and/or sequestering agents. Complexing agents will chemically combine with or physically hold the metal atom and/or metal ion to be removed using the compositions described herein.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, tungsten, other refractory metals and their nitrides and silicides, and combinations thereof.

As defined herein, "post-etch residue" corresponds to material remaining following gas-phase plasma etching processes, e.g., BEOL dual damascene processing, or wet etching processes. The post-etch residue may be organic, organometallic, organosilicic, or inorganic in nature, for example, silicon-containing material, carbon-based organic material, and etch gas residue such as oxygen and fluorine.

As defined herein, "post-ash residue," as used herein, corresponds to material remaining following oxidative or reductive plasma aching to remove hardened photoresist and/or bottom anti-reflective coating (BARC) materials. The post-ash residue may be organic, organometallic, organosilicic, or inorganic in nature.

"Substantially devoid" is defined herein as less than 2 wt. %, preferably less than 1 wt. %, more preferably less than 0.5 wt. %, and most preferably less than 0.1 wt. %, based on the total weight of the composition.

As used herein, "about" is intended to correspond to ±5% of the stated value.

As used herein, "suitability" for cleaning residue and contaminants from a microelectronic device having said residue and contaminants thereon corresponds to at least partial removal of said residue/contaminants from the microelectronic device. Cleaning efficacy is rated by the reduction of objects on the microelectronic device. For example, pre- and post-cleaning analysis may be carried out using an atomic force microscope. The particles on the sample may be registered as a range of pixels. A histogram (e.g., a Sigma Scan Pro) may be applied to filter the pixels in a certain intensity, e.g., 231-235, and the number of particles counted. The particle reduction may be calculated using:

$$\text{Cleaning Efficacy} = \frac{(\text{Number of PreClean Objects} - \text{Number of PostClean Objects})}{\text{Number of PreClean Objects}} \times 100$$

Notably, the method of determination of cleaning efficacy is provided for example only and is not intended to be limited to same. Alternatively, the cleaning efficacy may be considered as a percentage of the total surface that is covered by particulate matter. For example, AFM's may be programmed to perform a z-plane scan to identify topographic areas of interest above a certain height threshold and then calculate the area of the total surface covered by said areas of interest. One skilled in the art would readily understand that the less area covered by said areas of interest post-cleaning, the more efficacious the cleaning composition. Preferably, at least 75% of the residue/contaminants are removed from the microelectronic device using the compositions described herein, more preferably at least 90%, even more preferably at least 95%, and most preferably at least 99% of the residue/contaminants are removed.

Compositions described herein may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

The cleaning compositions comprise, consist of, or consist essentially of at least one basic salt, at least one organic solvent, at least one complexing agent, and water. Preferably the water is deionized. The cleaning composition is particularly useful for cleaning residue and contaminants, e.g., post-CMP residue, post-etch residue, post-ash residue, and contaminants from a microelectronic device structure.

In a further embodiment the cleaning composition comprises, consists of, or consists essentially of at least one basic salt, at least one organic solvent, at least one complexing agent, water, and optionally at least one surfactant.

Regardless of the embodiment, the cleaning compositions are substantially devoid of amine and ammonium-containing salts, e.g., quaternary ammonium bases. In addition, the compositions prior to use, e.g., clean chemistries, are preferably devoid of at least one of oxidizing agents; fluoride-containing sources; abrasive materials; alkaline earth metal bases; cross-linked organic polymer particles; and combinations thereof. In addition, the cleaning compositions should not solidify to form a polymeric solid, for example, photoresist. For the purposes of this invention, an "amine" is defined as at least one primary, secondary, or tertiary amine, ammonia, and/or quaternary ammonium hydroxide compounds (e.g., ammonium hydroxide, alkylammonium hydroxide, alkylarylammonium hydroxide, etc.), with the proviso that (i) an amide group, and (ii) species including both a carboxylic acid group and an amine group, are not considered amines for the purposes of this invention. Amines for the purposes of this invention include, but are not limited to: aliphatic primary, secondary, or tertiary amines; 4, 6, 7, 8, 9 or 10-membered saturated or unsaturated amine rings; alkylammonium hydroxide compounds having the general formula $R_1R_2R_3R_4NOH$ where $R_1$, $R_2$, $R_3$, and $R_4$ are the same as or different from one another and are hydrogen and $C_1$-$C_6$ alkyl groups (e.g., methyl, ethyl, propyl, butyl, pentyl or hexyl); alkylarylammonium hydroxide compounds have the general formula $R_1R_2R_3R_4NOH$ where $R_1$, $R_2$, $R_3$ and $R_4$ are the same as or different from one another and are hydrogen, $C_1$-$C_6$ alkyl groups (e.g., methyl, ethyl, propyl, butyl, pentyl or hexyl) and substituted or unsubstituted $C_6$-$C_{10}$ aryl groups (e.g., benzyl); and alkanolamines.

For the purposes of the composition and method described herein, the at least one basic salt may include cesium hydroxide, rubidium hydroxide, potassium hydroxide, and combinations thereof, preferably cesium hydroxide and/or rubidium hydroxide, even more preferably cesium hydroxide. Preferably, the at least one basic salt is chosen so the composition described herein substantially maintains its initial pH even after several factors of dilution, e.g., diluted pH=initial pH±2 pH units, more preferably the diluted pH=initial pH±about 1 pH unit.

The at least one organic solvent is preferably a polyol, a sulfone, or combinations thereof, whereby the polyol can comprise at least one species selected from the group consisting of ethylene glycol, propylene glycol, neopentyl glycol, glycerine (also known as glycerol), diethylene glycol, dipropylene glycol, 1,4-butanediol, 2,3-butylene glycol, 1,3-pentanediol, 1,4-pentanediol, 1,5-pentanediol, and combinations thereof. The sulfone may comprise at least one species selected from the group consisting of tetramethylene sulfone (sulfolane), dimethyl sulfone, diethyl sulfone, bis(2-hydroxyethyl) sulfone, methyl sulfolane, ethyl sulfolane, and combinations thereof. Preferably, the at least one organic solvent comprises glycerine, propylene glycol, ethylene glycol, as a single solvent or any combination of the three.

The complexing agent may comprise at least one of ethylenediaminetetraacetic acid (EDTA), 1,2-cyclohexanediamine-N,N,N'',N''-tetraacetic acid (CDTA), glycine, ascorbic acid, iminodiacetic acid (IDA), nitrilotriacetic acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, gallic acid, boric acid, acetic acid, acetone oxime, acrylic acid, adipic acid, betaine, dimethyl glyoxime, formic acid, fumaric acid, gluconic acid, glutaric acid, glyceric acid, glycolic acid, glyoxylic acid, isophthalic acid, itaconic acid, lactic acid, maleic acid, maleic anhydride, malic acid, malonic acid, mandelic acid, 2,4-pentanedione, phenylacetic acid, phthalic acid, proline, propionic acid, pyrocatecol, pyromellitic acid, quinic acid, sorbitol, succinic acid, tartaric acid, terephthalic acid, trimellitic acid, trimesic acid, tyrosine, xylitol, salts and derivatives thereof, and combinations thereof. Preferably, the at least one complexing agent comprises iminodiacetic acid, boric acid, gallic acid, as a single complexing agent or any combination of the three.

Illustrative surfactants for use in the compositions described herein include, but are not limited to, amphoteric salts, cationic surfactants, anionic surfactants, fluoroalkyl surfactants, non-ionic surfactants, and combinations thereof including, but not limited to, SURFONYL® 104, TRITON® CF-21, ZONYL® UR, ZONYL® FSO-100, ZONYL® FSN-100, 3M Fluorad fluorosurfactants (i.e., FC-4430 and FC-4432), dioctylsulfosuccinate salt, 2,3-dimercapto-1-propanesulfonic acid salt, dodecylbenzenesulfonic acid, polyethylene glycols, polypropylene glycols, polyethylene or polypropylene glycol ethers, carboxylic acid salts, $R_1$ benzene sulfonic acids or salts thereof (where the $R_1$ is a straight-chained or branched $C_8$-$C_{18}$ alkyl group), amphiphilic fluoropolymers, polyethylene glycols, polypropylene glycols, polyethylene or polypropylene glycol ethers, carboxylic acid salts, dodecylbenzenesulfonic acid, polyacrylate polymers, dinonylphenyl polyoxyethylene, silicone or modified silicone polymers, acetylenic diols or modified acetylenic diols, alkylammonium or modified alkylammonium salts, as well as combinations comprising at least one of the foregoing surfactants, sodium dodecyl sulfate, zwitterionic surfactants, aerosol-OT (AOT) and fluorinated analogues thereof, alkyl ammonium, perfluoropolyether surfactants, 2-sulfosuccinate salts, phosphate-based surfactants, sulfur-based surfactants, and acetoacetate-based polymers. In a preferred embodiment, the surfactant includes an alkyl benzene sulfonic acid, more preferably dodecylbenzenesulfonic acid.

The pH of the cleaning compositions described herein is greater than 7, preferably in a range from about 8 to greater than 14, more preferably in a range from about 8 to about 13.

In a particularly preferred embodiment, the cleaning composition comprises, consists of, or consists essentially of (a) cesium hydroxide, glycerine, iminodiacetic acid and water, (b) cesium hydroxide, glycerine, boric acid and water, (c) cesium hydroxide, propylene glycol, gallic acid and water, (d) cesium hydroxide, ethylene glycol, iminodiacetic acid and water, and (e) cesium hydroxide, propylene glycol, boric acid, and water. In each case, the compositions are substantially devoid of amine and ammonium-containing salts, e.g., quaternary ammonium bases; oxidizing agents; fluoride-containing sources; abrasive materials; alkaline earth metal bases; and combinations thereof.

Examples of the compositions described herein are selected from the group consisting of Formulations A-R:

Formulation A: 4.0 wt % CsOH (50%), 12 wt % ethylene glycol, 0.8 wt % IDA, 83.2 wt % water, pH concentrated=12.22, pH diluted (30:1)=10.36

Formulation B: 7.1 wt % CsOH (50%), 5 wt % ethylene glycol, 1.6 wt % IDA, 86.3 wt % water, pH concentrated=11.88, pH diluted (30:1)=10.27

Formulation C, 5.7 wt % CsOH (50%), 12 wt % ethylene glycol, 0.8 wt % IDA, 1 wt % ascorbic acid, 80.5 wt % water, pH concentrated=11.41, pH diluted (30:1)=9.89

Formulation D: 9.1 wt % CsOH (50%), 12 wt % ethylene glycol, 1.6 wt % IDA, 1 wt % ascorbic acid, 76.3 wt % water, pH concentrated=11.16, pH diluted (30:1)=10.1

Formulation E: 3.9 wt % CsOH (50%), 5.0 wt % glycerine, 0.8 wt % IDA, 90.3 wt % water, pH concentrated=12.0, pH diluted (30:1)=10.16

Formulation F: 4.0 wt % CsOH (50%), 12.0 wt % glycerine, 0.8 wt % IDA, 83.2 wt % water, pH concentrated=11.1, pH diluted (30:1)=9.5

Formulation G: 7.1 wt % CsOH (50%), 5.0 wt % glycerine, 1.6 wt % IDA, 86.3 wt % water, pH concentrated=11.5, pH diluted (30:1)=10.29

Formulation H, 5.7 wt % CsOH (50%), 12.0 wt % glycerine, 0.8 wt % IDA, 1.0 wt % ascorbic acid, 80.5 wt % water, pH concentrated=10.8, pH diluted (30:1)=9.61

Formulation I: 8.8 wt % CsOH (50%), 5.0 wt % glycerine, 1.6 wt % IDA, 1.0 wt % ascorbic acid, 83.6 wt % water, pH concentrated=12.3, pH diluted (30:1)=10.64

Formulation J: 7.4 wt % CsOH (50%), 12.0 wt % glycerine, 1.6 wt % IDA, 79.0 wt % water, pH concentrated=10.7, pH diluted (30:1)=9.81

Formulation K: 6.3 wt % CsOH (50%), 4.8 wt % propylene glycol, 2 wt % gallic acid, 86.9 wt % water, pH concentrated=9.71

Formulation L: 6.6 wt % CsOH (50%), 10 wt % propylene glycol, 2 wt % gallic acid, 81.4 wt % water, pH concentrated=10.32

Formulation M: 15.7 wt % CsOH (50%), 4.8 wt % propylene glycol, 5 wt % gallic acid, 74.5 wt % water, pH concentrated=10.14

Formulation N, 16.2 wt % CsOH (50%), 4.8 wt % propylene glycol, 5 wt % gallic acid, 1 wt % ascorbic acid, 73 wt % water, pH concentrated=9.28

Formulation O: 2.1 wt % CsOH (50%), 8.5 wt % glycerine, 0.4 wt % iminodiacetic acid, 89.0 wt % water Formulation P: 2.5 wt % CsOH (50%), 12 wt % ethylene glycol, 0.6 wt % iminodiacetic acid, 84.9 wt % water Formulation Q: 4 wt % CsOH (50%), 12 wt % glycerine, 3.3 wt % boric acid, 80.7 wt % water, pH concentrated=7.17, pH diluted (100:1)=8.54

Formulation R: 4 wt % CsOH (50%), 4.8 wt % propylene glycol, 3.3 wt % boric acid, 87.9 wt % water, pH concentrated=8.4, pH diluted (100:1)=8.59

The concentrations of the components in a concentrate are preferably as follows:

| component | preferable weight % |
| --- | --- |
| basic salt(s) (not diluted) | about 1 to about 9 wt % |
| organic solvent(s) | about 4 to about 12 wt % |
| complexing agent(s) | about 0.1 to about 4 wt % |
| water | about 75 to about 99 wt % |

With regards to compositional amounts, the weight percent ratios of each component is preferably as follows: about 0.1:1 to about 10:1 basic salt to complexing agent, preferably about 0.5:1 to about 4:1, and most preferably about 1:1 to about 3:1; and about 0.1:1 to about 25:1 organic solvent to complexing agent, preferably about 1:1 to about 20:1, and most preferably about 2:1 to about 15:1.

The range of weight percent ratios of the components will cover all possible concentrated or diluted embodiments of the composition. Towards that end, in one embodiment, a concentrated cleaning composition is provided that can be diluted for use as a cleaning solution. A concentrated composition, or "concentrate," advantageously permits a user, e.g., CMP process engineer, to dilute the concentrate to the desired strength and pH at the point of use. Dilution of the concentrated cleaning composition may be in a range from about 1:1 to about 2500:1, preferably about 5:1 to about 1500:1, and most preferably about 10:1 to about 1000:1, wherein the cleaning composition is diluted at or just before the tool with solvent, e.g., deionized water. It is to be appreciated by one skilled in the art that following dilution, the range of weight percent ratios of the components relative to one another should remain unchanged.

The compositions described herein may have utility in applications including, but not limited to, post-etch residue removal, post-ash residue removal surface preparation, post-plating cleaning and post-CMP residue removal.

In yet another preferred embodiment, the cleaning compositions described herein further include residue and/or contaminants. Importantly, the residue and contaminants may be dissolved and/or suspended in the compositions. Preferably, the residue includes post-CMP residue, post-etch residue, post-ash residue, contaminants, or combinations thereof. For example, the cleaning composition can comprise, consist of, or consist essentially of at least one basic salt, at least one organic solvent, at least one complexing agent, water, optionally at least one surfactant, and residue and/or contaminants.

The cleaning compositions are easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, another aspect relates to a kit including, in one or more containers, one or more components adapted to form the compositions described herein. The kit may include, in one or more containers, at least one basic salt, at least one organic solvent, at least one complexing agent, optionally at least one surfactant, and optionally water, for combining with additional water at the fab or the point of use. The containers of the kit must be suitable for storing and shipping said removal compositions, for example, NOWPak® containers (Advanced Technology Materials, Inc., Danbury, Conn., USA).

The one or more containers which contain the components of the removal composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended removal composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" U.S. Patent Application No. 60/916,966 entitled "SYSTEMS AND METHODS FOR MATERIAL BLENDING AND DISTRIBUTION" filed on May 9, 2007 in the name of John E. Q. Hughes, and PCT/US08/63276 entitled "SYSTEMS AND METHODS FOR MATERIAL BLENDING AND DISTRIBUTION" filed on May 9, 2008 in the name of Advanced Technology Materials, Inc.

As applied to microelectronic manufacturing operations, the cleaning compositions described herein are usefully employed to clean residue (e.g., post-CMP residue) and/or contaminants from the surface of the microelectronic device. Importantly, the cleaning compositions do not damage low-k dielectric materials or corrode metal interconnects on the device surface. Moreover, the cleaning compositions do not readily remove silicon or silicone materials. Preferably the cleaning compositions remove at least 85% of the residue present on the device prior to residue removal, more preferably at least 90%, even more preferably at least 95%, and most preferably at least 99%.

In post-CMP residue and contaminant cleaning application, the cleaning composition may be used with a large variety of conventional cleaning tools such as megasonics and brush scrubbing, including, but not limited to, Verteq single wafer megasonic Goldfinger, OnTrak systems DDS (double-sided scrubbers), SEZ or other single wafer spray rinse, Applied Materials Mirra-Mesa™/Reflexion™/Reflexion LK™, and Megasonic batch wet bench systems.

In use of the compositions described herein for cleaning post-CMP residue, post-etch residue, post-ash residue and/or contaminants from microelectronic devices having same thereon, the cleaning composition typically is contacted with the device for a time of from about 5 sec to about 10 minutes, preferably about 1 sec to 20 min, preferably about 15 sec to about 5 min at temperature in a range of from about 20° C. to about 90° C., preferably about 20° C. to about 50° C. Such contacting times and temperatures are illustrative, and any other suitable time and temperature conditions may be employed that are efficacious to at least partially clean the post-CMP residue/contaminants from the device, within the broad practice of the method. "At least partially clean" and "substantial removal" both correspond to removal of at least 85% of the residue present on the device prior to residue removal, more preferably at least 90%, even more preferably at least 95%, and most preferred at least 99%

Following the achievement of the desired cleaning action, the cleaning composition may be readily removed from the device to which it has previously been applied, as may be desired and efficacious in a given end use application of the compositions described herein. Preferably, the rinse solution includes deionized water. Thereafter, the device may be dried using nitrogen or a spin-dry cycle.

Advantages of the composition and method of the invention include, but are not limited to, substantial removal of particles from the surface, substantial removal of organic and metallic residues from the surface, a passivated metal, e.g., copper, surface, a substantially unmodified porous low-k dielectric, and low metal surface roughness. In addition, the compositions are preferably environmentally friendly.

Yet another aspect relates to the improved microelectronic devices made according to the methods described herein and to products containing such microelectronic devices.

Another aspect relates to a recycled cleaning composition, wherein the cleaning composition may be recycled until residue and/or contaminant loading reaches the maximum amount the cleaning composition may accommodate, as readily determined by one skilled in the art.

A still further aspect relates to methods of manufacturing an article comprising a microelectronic device, said method comprising contacting the microelectronic device with a cleaning composition for sufficient time to clean residue and contaminants from the microelectronic device having said residue and contaminants thereon, and incorporating said microelectronic device into said article, using a cleaning composition described herein.

In another aspect, a method of removing post-CMP residue and contaminants from a microelectronic device having same thereon is described, said method comprising:

polishing the microelectronic device with a CMP slurry;
    contacting the microelectronic device with a cleaning composition comprising, consisting of or consisting essentially of at least one basic salt, at least one organic solvent, at least one complexing agent, optionally at least one surfactant, and water, for a sufficient time to remove post-CMP residue and contaminants from the microelectronic device to form a post-CMP residue-containing composition; and
    continuously contacting the microelectronic device with the post-CMP residue-containing composition for a sufficient amount of time to effect substantial cleaning of the microelectronic device,
wherein the cleaning composition is substantially devoid of amine and ammonium-containing salts, e.g., quaternary ammonium bases; oxidizing agents; fluoride-containing sources; abrasive materials; alkaline earth metal bases; and combinations thereof.

Another aspect relates to an article of manufacture comprising a cleaning composition, a microelectronic device wafer, and material selected from the group consisting of residue, contaminants and combinations thereof, wherein the cleaning composition comprises at least one basic salt, at least one organic solvent, at least one complexing agent, optionally at least one surfactant, and water, and wherein the residue comprises at least one of post-CMP residue, post-etch residue and post-ash residue.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A method of removing post-chemical mechanical polishing (post-CMP) residue and contaminants from a microelectronic device having said post-CMP residue and contaminants thereon, said method comprising contacting the microelectronic device with a cleaning composition for sufficient time to at least partially clean said post-CMP residue and contaminants from the microelectronic device, wherein the cleaning composition includes at least one basic salt; at least one organic solvent; at least one chelating agent; and water, wherein the cleaning composition is substantially devoid of amine and ammonium-containing salts.

2. The method of claim 1, wherein said contacting comprises conditions selected from the group consisting of: time of from about 15 seconds to about 5 minutes; temperature in a range of from about 20° C. to about 50° C.; and combinations thereof.

3. The method of claim 1, further comprising diluting the cleaning composition with solvent at or before a point of use.

4. The method of claim 1, wherein the at least one basic salt comprises a species selected from the group consisting of cesium hydroxide, rubidium hydroxide, potassium hydroxide, and combinations thereof.

5. The method of claim 1, wherein the at least one basic salt comprises cesium hydroxide.

6. The method of claim 1, wherein the at least one basic salt comprises a species selected from the group consisting of cesium hydroxide and rubidium hydroxide.

7. The method of claim 1, wherein the at least one organic solvent comprises a glycol, a sulfone, or a combination thereof.

8. The method of claim 1, wherein the at least one organic solvent comprises a species selected from the group consisting of ethylene glycol, propylene glycol, neopentyl glycol, glycerine, diethylene glycol, dipropylene glycol, 1,4-butanediol, 2,3-butylene glycol, 1,3-pentanediol, 1,4-pentanediol, 1,5-pentanediol, tetramethylene sulfone (sulfolane), dimethyl sulfone, diethyl sulfone, bis(2-hydroxyethyl) sulfone, methyl sulfolane, ethyl sulfolane, and combinations thereof.

9. The method of claim 1, wherein the at least one organic solvent comprises a species selected from the group consisting of ethylene glycol, propylene glycol, glycerine, and combinations thereof.

10. The method of claim 1, wherein the at least one complexing agent comprises a species selected from the group consisting of ethylenediaminetetraacetic acid (EDTA), 1,2-cyclohexanediamine-N,N,N',N'-tetraacetic acid (CDTA), glycine, ascorbic acid, iminodiacetic acid (IDA), nitrilotriacetic acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, gallic acid, boric acid, acetic acid, acetone oxime, acrylic acid, adipic acid, betaine, dimethyl glyoxime, formic acid, fumaric acid, gluconic acid, glutaric acid, glyceric acid, glycolic acid, glyoxylic acid, isophthalic acid, itaconic acid, lactic acid, maleic acid, maleic anhydride, malic acid, malonic acid, mandelic acid, 2,4-pentanedione, phenylacetic acid, phthalic acid, proline, propionic acid, pyrocatecol, pyromellitic acid, quinic acid, sorbitol, succinic acid, tartaric acid, terephthalic acid, trimellitic acid, trimesic acid, tyrosine, xylitol, salts and derivatives thereof, and combinations thereof.

11. The method of claim 1, wherein the at least one complexing agent comprises iminodiacetic acid (IDA), gallic acid, boric acid, or combinations thereof.

12. The method of claim 1, wherein the cleaning compositions are substantially devoid of oxidizing agents; fluoride-containing sources; abrasive materials; alkaline earth metal bases; cross-linked organic polymer particles; and combinations thereof.

13. The method of claim 1, wherein the cleaning composition is selected from the group consisting of: (a) cesium hydroxide, glycerine, iminodiacetic acid and water, (b) cesium hydroxide, glycerine, boric acid and water, (c) cesium hydroxide, propylene glycol, gallic acid and water, (d) cesium hydroxide, ethylene glycol, iminodiacetic acid and water, and (e) cesium hydroxide, propylene glycol, boric acid, and water.

14. The method of claim 1, wherein the cleaning composition further comprises post-CMP residue and contaminants.

15. The method of claim 3, wherein the cleaning composition is diluted in a range from about 10:1 to about 1000:1.

16. The method of claim 1, wherein the cleaning compositions do not solidify to form a polymeric solid.

17. The method of claim 1, further comprising at least one surfactant.

* * * * *